(12) United States Patent
Givens

(10) Patent No.: US 7,510,961 B2
(45) Date of Patent: Mar. 31, 2009

(54) UTILIZATION OF ENERGY ABSORBING LAYER TO IMPROVE METAL FLOW AND FILL IN A NOVEL INTERCONNECT STRUCTURE

(75) Inventor: John H. Givens, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 08/801,812

(22) Filed: Feb. 14, 1997

(65) Prior Publication Data
US 2001/0049190 A1    Dec. 6, 2001

(51) Int. Cl.
*H01L 21/4763* (2006.01)
(52) U.S. Cl. .................. 438/632; 438/628; 438/629; 438/643; 438/644; 438/646; 257/E21.579; 257/E21.584; 257/E21.588
(58) Field of Classification Search .......... 438/626, 438/631, 638, 643, 644, 645, 646, 653, 654, 438/656, 660, 662, 663, 688, 629, 637, 647, 438/668, 628, 632, 648, 672, 685, 687, 627; 257/E21.579, E21.578, E21.575, E21.584, 257/E21.585, E21.588
See application file for complete search history.

(56) References Cited
U.S. PATENT DOCUMENTS

| | | | | |
|---|---|---|---|---|
| 4,472,456 A | | 9/1984 | Shah | 427/53.1 |
| 4,700,465 A | * | 10/1987 | Sirkin | 438/533 |
| 4,997,518 A | * | 3/1991 | Madokoro | 156/646 |
| 5,008,216 A | * | 4/1991 | Huang et al. | 438/656 |
| 5,274,210 A | | 12/1993 | Freedman et al. | 219/121.63 |
| 5,380,678 A | * | 1/1995 | Yu et al. | 438/627 |
| 5,391,517 A | * | 2/1995 | Gelatos et al. | 438/643 |
| 5,409,862 A | * | 4/1995 | Wada et al. | 438/607 |

(Continued)

FOREIGN PATENT DOCUMENTS
JP      01-302842       12/1989

OTHER PUBLICATIONS http://en.wikipedia.org/wiki/Main_Page.*

*Primary Examiner*—Matthew Smith
*Assistant Examiner*—Julio J. Maldonado
(74) *Attorney, Agent, or Firm*—TraskBritt

(57) ABSTRACT

A method for manufacturing an interconnect structure situated on a semiconductor wafer having a substrate assembly thereon. The interconnect structure is formed in a recess such as a trench, a hole, a via, or a combination of a trench and a hole or via within a dielectric material situated on the substrate assembly of the semiconductor wafer. At least one barrier layer is deposited within the recess. A seed layer helping to promote nucleation, deposition, and growth of a material that will be used to fill up the recess is then deposited on the barrier layer. An electrically conductive layer is then formed upon the seed layer. An energy absorbing layer will then be formed upon the conductor layer, where the energy absorbing layer has a greater thermal absorption capacity than that of the electrically conductive layer. The energy absorbing layer is heated, with or without an applied heightened pressure, to cause the conductor layer to flow so as to fill voids that have formed within the dielectric structure. Following the steps of heating or heating and pressurizing the energy absorbing layer, both the energy absorbing layer and a portion of the conductive layer situated above the dielectric structure are removed.

16 Claims, 1 Drawing Sheet

U.S. PATENT DOCUMENTS

| | | | | |
|---|---|---|---|---|
| 5,420,072 A | * | 5/1995 | Fiordalice et al. | 438/607 |
| 5,578,523 A | * | 11/1996 | Fiordalice et al. | 438/633 |
| 5,602,053 A | * | 2/1997 | Zheng et al. | 438/600 |
| 5,635,423 A | * | 6/1997 | Huang et al. | 438/637 |
| 5,653,810 A | * | 8/1997 | Kataoka et al. | 118/723 |
| 5,668,055 A | * | 9/1997 | Xu et al. | 438/637 |
| 5,702,982 A | * | 12/1997 | Lee et al. | 438/620 |
| 5,821,620 A | | 10/1998 | Hong | 257/751 |
| 5,824,599 A | * | 10/1998 | Schacham-Diamand | 438/678 |
| 5,847,461 A | * | 12/1998 | Xu et al. | 257/751 |
| 5,869,395 A | * | 2/1999 | Yim | 438/637 |
| 5,926,736 A | * | 7/1999 | deSilva | 438/637 |
| 5,956,612 A | | 9/1999 | Elliott et al. | 438/637 |
| 5,990,556 A | * | 11/1999 | Mizobuchi et al. | 257/750 |
| 6,069,068 A | | 5/2000 | Rathore et al. | 438/628 |
| 6,217,721 B1 | * | 4/2001 | Xu et al. | 204/192.17 |
| 6,306,761 B1 | * | 10/2001 | Taguchi | 438/646 |
| 6,333,265 B1 | * | 12/2001 | Dixit et al. | 438/680 |

\* cited by examiner

UTILIZATION OF ENERGY ABSORBING LAYER TO IMPROVE METAL FLOW AND FILL IN A NOVEL INTERCONNECT STRUCTURE

BACKGROUND OF THE INVENTION

1. The Field of the Invention

The present invention relates to a metallized integrated circuit structure, and particularly to a metallized interconnect structure situated on a semiconductor substrate assembly and methods for making.

2. The Relevant Technology

Current technology for metallization of an integrated circuit involves the forming of a conductive layer over the integrated circuit. A typical metallization process is one that is performed at the "back end of the line," which is after the formation of integrated circuits that are to be wired by the metallization process. A single conductive layer is often formed so that it is situated above the integrated circuit to be wired. After the conductive layer is formed, it is then patterned and etched into a shape of the desired wiring necessary to metallize the integrated circuit. Since the conductive layer is situated above the integrated circuit, the resultant metallization will also be above the integrated circuit in a "wiring-up" scheme.

Another type of metallization involves the formation of a conductive layer at least in part below the integrated circuit in a recess composed of an electrically insulative or dielectric material. Such a wiring scheme may be described as a "wiring-down" scheme. The recess can be either a trench, a hole, or a via. Depending upon the aspect ratio of the recess, poor step coverage of the conductive layer within the recess may result. Voids in the conductive layer within the recess may also result when the conductive layer does not completely fill up the recess. Voids and poor step coverage can cause the integrated circuit to experience an electrical failure. The electrical failure can be experienced during fabrication of the integrated circuit or after a period of time that the integrated circuit has been in use, such as where electrical contact with the conductive layer in the recess has been lost because the material of the conductive layer moves.

It would be an advantage in the art to overcome the problems of poor step coverage and voids.

SUMMARY OF THE INVENTION

In accordance with the invention as embodied and broadly described herein, the present invention relates to a method for manufacturing an interconnect structure situated on a semiconductor wafer having a substrate assembly thereon. A novel interconnect structure is also disclosed. The term "substrate assembly" is intended herein to mean a substrate having one or more layers or structures formed thereon. As such, the substrate assembly may be, by way of example and not by way of limitation, a doped silicon semiconductor substrate typical of a semiconductor wafer.

The interconnect structure is formed in a dielectric material situated on the substrate assembly of the semiconductor wafer. The novel process forms the dielectric material into a recess having a specified geometrical shape. The shape formed in the dielectric material will preferably be a recess therein. The recess can be a trench, a hole, a via, or a combination of a trench and a hole or via. The dielectric shape can be formed by processing the dielectric material by way of dry etching or other recess-creating process.

Following the creation of the dielectric structure in the dielectric material, at least one diffusion barrier layer is formed over the dielectric structure. The diffusion barrier layer is at least partially conformably formed upon the dielectric structure. The material from which the diffusion barrier layer is substantially composed is preferably selected from the group consisting of ceramics, metallics, and intermetallics. More preferably, the diffusion barrier layer is substantially composed of a material that is selected from the group consisting of aluminum nitride, tungsten nitride, titanium nitride, and tantalum nitride.

A seed layer is then formed upon the diffusion barrier layer. The seed layer helps to promote nucleation, deposition, and growth of a material that will be used to fill up the dielectric structure. The seed layer can also serve the purpose of increasing surface mobility of the diffusion barrier layer, which helps to make a desirable filling of the dielectric structure in the metallization process. Preferably, the material from which the seed layer is substantially composed is selected from the group consisting of ceramics, metallics, and intermetallics. More preferably, the material from which the seed layer is composed is selected from the group consisting of aluminum, titanium nitride, titanium, and titanium aluminide. Additionally, and by comparison, the diffusion barrier layer will preferably be composed of a material having a melting point greater than or equal to that of the material from which the seed layer is composed.

An electrically conductive layer is then formed upon the seed layer. The electrically conductive layer is the current carrier for electrical signals that will communicate with an integrated circuit associated therewith. Preferably, the electrically conductive layer is substantially composed of aluminum or copper. The material from which the diffusion barrier layer is composed will preferably have a melting point greater than that of a material from which the electrically conductive layer is composed. The material from which the seed layer is composed will preferably have a melting point greater than or equal to that of the material from which the electrically conductive layer is composed.

An energy absorbing layer is then formed upon the conductor layer. The energy absorbing layer will preferably have a greater thermal absorption capacity than that of the electrically conductive layer. Alternatively, the energy absorbing layer will preferably be composed of a material having a higher melting point than that of the material from which the electrically conductive layer is composed. As another alternative, the energy absorbing layer will preferably be composed of a material having both a higher thermal insulation capacity and electric insulation capacity than that of the material from which the electrically conductive layer is composed.

The energy absorbing layer is heated to cause the conductor layer to flow so as to fill voids that have formed within the dielectric structure. In conjunction with the heating of the energy absorbing layer, a pressure above atmospheric pressure can be applied to the semiconductor substrate assembly to better assist the process of causing the conductor layer to flow so as to fill voids within the dielectric structure. Preferably, the energy absorbing layer is substantially composed of a material selected from the group consisting of titanium, titanium nitride, tungsten, tungsten nitride, silicon nitride, silicon dioxide, tantalum, tantalum nitride, and carbon.

Following the steps of heating or heating and pressurizing the energy absorbing layer, the energy absorbing layer is removed, preferably by planarizing. The planarizing step may also remove a portion of the conductive layer situated above the dielectric structure.

BRIEF DESCRIPTION OF THE DRAWINGS

A more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE INVENTION

Figure 1:
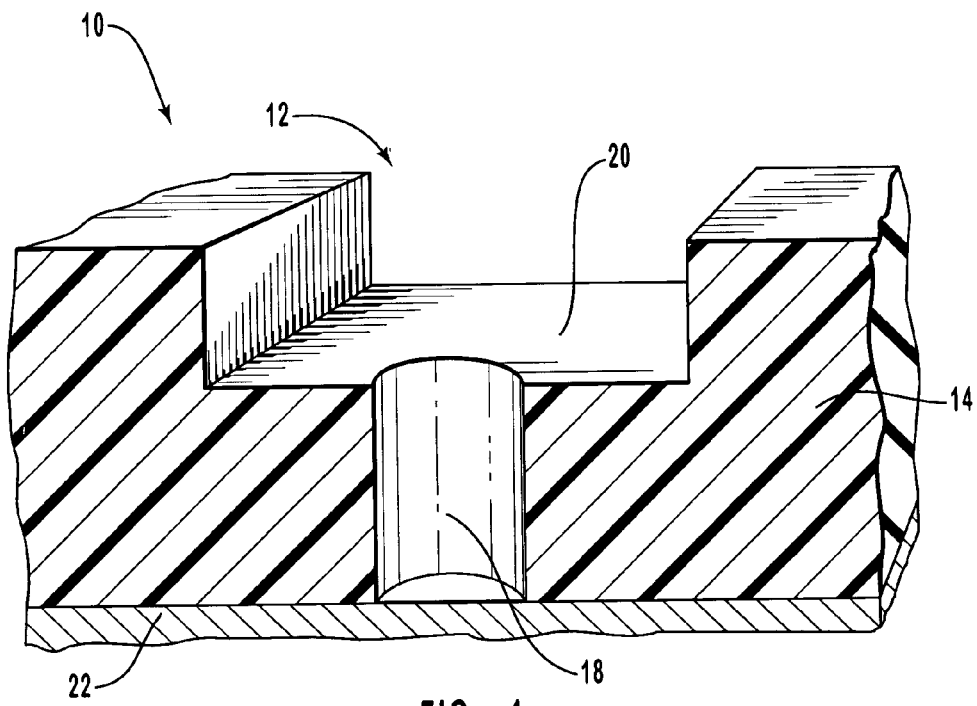
FIG. 1 is a partial cross-sectional elevation and perspective view of a dielectric material that is situated upon a monocrystalline silicon layer of a semiconductor wafer, the dielectric material having a dielectric structure formed therein that is shaped as a recess in the dielectric material, the recess featuring the combination of a hole extending to a trench in the dielectric material, the hole terminating at the monocrystalline silicon layer of the semiconductor wafer.

FIG. 1 depicts a semiconductor substrate assembly 10. A lower substrate known as silicon layer 22 is formed in semiconductor substrate assembly 10 and a dielectric material 14 is formed upon silicon layer 22. Lower substrate or silicon layer 22 defines a plane and comprises material selected from the group consisting of silicon dioxide, silicate glass, and mixtures or derivatives thereof. A hole 18 having a cylindrical shape extends from silicon layer 22 to terminate at a trench 20 formed in dielectric material 14. Trench 20 is rectangular in cross-section.

Figure 2:
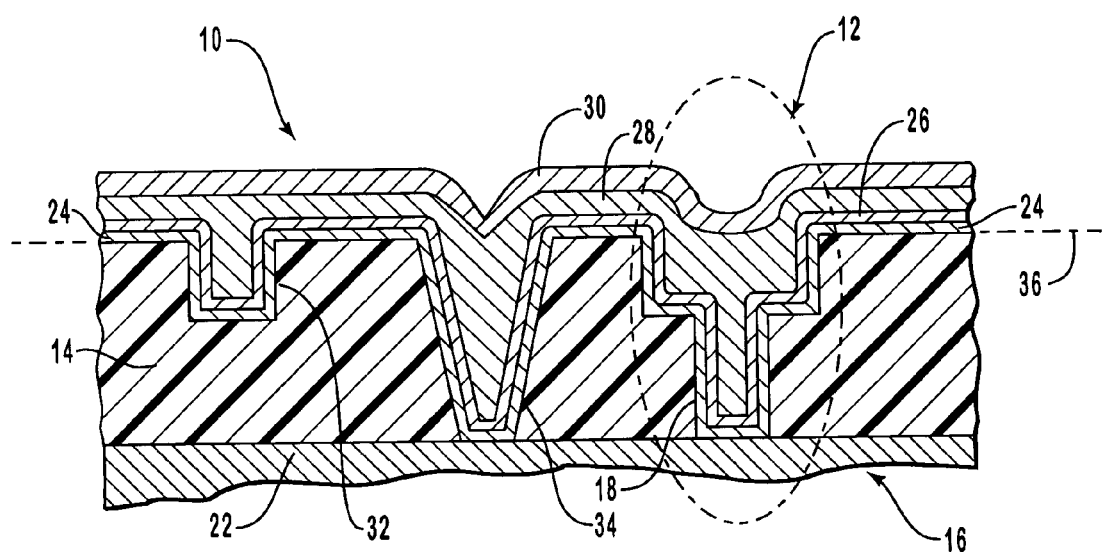
FIG. 2 is a partial perspective cross-sectional elevation view of a portion of FIG. 1, showing various interconnect structure, including a trench in the dielectric material, a hole in the dielectric material, and a combination thereof, each interconnect structure having thereon one or more layers of each of a barrier layer, a seed layer, a conductive layer, and an energy absorbing layer.

FIG. 2 shows a cross-section 12 as seen FIG. 1. Another trench 32, and another hole 34 are also depicted. Trench 32 is not situated over a hole as is trench 20. FIG. 2 also depicts a hole 34 having a triangular cross-section and extending from a top surface of dielectric material 14 to terminate at silicon layer 22. When filled with materials for a metallization process and subsequently planarized, holes 18, 34, and trenches 20, 32 become interconnect structures in the metallization process as described below.

To initiate the metallization process, dielectric material 14 is formed upon silicon layer 22 by conventional processing, such as depositing doped or undoped oxide by various CVD processes, or by TEOS deposition. Next, dielectric material 14 has recesses formed therein, including, for example, holes 18, 34, and trenches 20, 32, the formation of which is by conventional processing methods such as patterning and etching.

After dielectric material 14 has been processed into the desired configuration of recesses, the next step is to form a barrier layer 24 over dielectric structure 16. Barrier layer 24 may be formed, by way of example and not by way of limitation, by multiple deposition of a material. The material from which barrier layer 24 is composed preferably will act as an adhesion layer for materials formed thereon, and also will act as a diffusion barrier to prevent the diffusion of material through barrier layer 24.

Barrier layer 24 will preferably be a substantially continuous coating of material over the recesses in dielectric material 14. Barrier layer 24 may be comprised of refractory metals or nitrides thereof, such as titanium, tungsten, tantalum, titanium nitride, tungsten nitride, or tantalum nitride. Typically, barrier layer 24 is titanium and/or titanium nitride together. Barrier layer 24 can be particularly important in the areas where holes 18, 34 extend past dielectric material 14 to terminate at silicon layer 22.

The next step, which may be desirable in the inventive method depending upon the composition of materials used to fill the recesses in dielectric material 14, is to thermally process barrier layer 24. The thermal processing of barrier layer 24 helps to improve electrical contact of the interconnect structures being formed. For example, if titanium is deposited, then it is desirable that a thermal process be performed. The thermal process would preferably be heating the semiconductor substrate assembly in a nitrogen environment at a selected temperature at which nitrides are formed on the surface of the titanium. If barrier layer 24 comprises titanium or titanium nitride, argon may be used as the environment for thermal processing. In this example, titanium exposed to the nitrogen environment would form titanium nitride and exposed silicon would form silicon nitride. As the thermal process heats the semiconductor substrate assembly, titanium silicide would form so as to create a desirable contact resistance with silicon layer 22.

A seed layer 26 is formed over barrier layer 24 in the next step of the inventive method. The type of material used as seed layer 26 is dependant upon subsequent processing. If some type of subsequent reflow process is needed for later added layers, or even a CVD process is going to be used for the formation of seed layer 26, seed layer 26 will preferably be formed prior to subsequent processing so as to clean barrier layer 24. The use of seed layer 26 provides a surface on barrier layer 24 that is substantially free of contaminates that may interfere with surface diffusion. Seed layer 26 promotes the deposition and growth of a layer of material that will be formed thereon. Additionally, seed layer 26 will preferably be the main conductor for current in the interconnect structure and will promote surface mobility of materials formed thereon so as to fill the recesses in dielectric material 14 in a desirable manner.

By way of example of materials and processes for formation of seed layer 26, a CVD tungsten process can be used. When so processed, there will be a nucleation of seed layer 26 that will be rich in both silicon and hydrogen, initially. The CVD tungsten process will then preferably undergo a chemistry change in the middle thereof, so as to become rich in hexaflouride such that a more pure form of tungsten material makes up seed layer 26. Those of ordinary skill in the art will understand the selection of proper seed layer 26 compositions, which selection may be done empirically by utilizing chemical potential differences and differences in diffusion characteristics of materials.

The seed layer may also be made of titanium nitride, which is preferred when aluminum is used in the interconnect structures. If so, the seed layer should be deposited in situ prior to filling the interconnect structures with aluminum so as to enable the aluminum to freely flow and to avoid binding up the flow of the aluminum. Multiple layers can be used to make up the seed layer. The multiple layers will preferably be deposited in a vacuum system and will be composed of, for example, both titanium nitride and/or silicon.

The next step in the inventive method is the formation of a conductor layer 28. Conductor layer 28 will preferably be composed of typical metallization conductor materials. For example, if a reflow or a fill process with aluminum process is going to be used, then an aluminum and high pressure fill would be used to substantially cover seed layer 26 in the recesses within dielectric material 14. The composition of conductor layer 28 may depend on the aspect ratio of the recesses within dielectric material 14. Aspect ratios below four (4) may not require a high pressure fill of the recesses. Another example of a conductor material is copper.

When aluminum is used as conductor layer 28, the composition of barrier layer 24 will preferably be selected to avoid a heat induced reaction of the aluminum with the silicon in silicon layer 22 so as to form tetrahedrons in the silicon, whereby a detrimental effect is realized.

An energy absorbing layer 30 is then formed, preferably by deposition, upon conductor layer 28. Energy absorbing layer 30 retains thermal energy and comprises a material that has a lower thermal conductivity than conductor layer 28. By way of example and not limitation, if conductor layer 28 is composed of aluminum and energy absorbing layer 30 is composed of tungsten, the tungsten has a higher melting point than aluminum. This results in the tungsten retaining more energy.

From a spectral point of view, if aluminum is used as conductor layer 28 and depending on how the aluminum layer is deposited, it is possible to obtain something that is not as spectrally reflective. A preferable characteristic of energy absorbing layer 30 is that it must be able to absorb more energy than the material that is used as conductor layer 28. The purpose behind this requirement is that when challenging structures (e.g., recesses in dielectric material 14 having aspect ratios greater than four to one (4:1)) are being formed that are to be filled with a conductor, the conductor will flow more freely to fill a recess when thermal energy is retained within the conductor by a layer thereon that will better retain such thermal energy. As such, the flowablility of the conductor is enhanced so that diffusion thereof into the recess is bettered.

Enhancing the diffusion characteristics of the material of the conductor is achieved by either volume diffusion or surface diffusion, each of which are time and temperature dependent. The temperature of the conductor layer 28 is held high for a longer period of time while underlying or overlying materials retain thermal energy. The formation of energy absorbing layer 30 on conductor layer 28 substantially retains thermal energy under an interfacial surface of energy absorbing layer 30 so that the thermal energy can diffuse into conductor layer 28.

By way of example, if conductor layer 28 is aluminum, energy absorbing layer 30 can be titanium nitride, tungsten, or even a dielectric substance. A layer of titanium nitride is more thermally conductive than aluminum. If conductor layer 28 is copper, examples of energy absorbing layer 30 are tungsten, titanium nitride, tantalum or carbon.

The next step of the inventive method is to apply energy to energy absorbing layer 30. The energy that is applied to energy absorbing layer 30 is transmitted to conductor layer 28. Conductor layer 28 is then able to flow and fill voids that have formed in recesses within dielectric material 14. With the voids removed, desirable step coverage of the recesses within dielectric material 14, and desirable fill of the recesses is achieved. Examples of ways to apply energy to energy absorbing layer 30 include, but are not limited to, lasers, tube furnaces, RTP or other kinds of radiant or thermal energy. Preferably, energy absorbing layer 30 will be heated.

A preferable step that follows the foregoing steps is the removal of materials from the semiconductor substrate assembly 10 by an abrasive planarizing process, for example, chemical mechanical planarizing. Material will be removed during the planarizing process until planarization line 36, seen in FIG. 2 as dashed lines, is reached. The resulting interconnect structures have been metallized so as to be buried within dielectric material 14 and, as such, can be considered to be a metallization by "wire-down" technology. Subsequent and conventional processing can then follow in the fabrication processing of the semiconductor substrate assembly 10.

FIG. 2 shows a novel dual damascene structure depicted as hole 18 and trench 20 filled with each of barrier layer 24, seed layer 26, and conductor layer 28, where trench 20 has been planarized at planarization line 36. Planarization line 36 makes the metallization in an "inlaid" form. The two or "dual" metallization damascene structure is seen in the inlaid combination of both hole 18 and trench 20.

The disclosed novel method is capable of desirable step coverage and being capable of filling in a recess within a dielectric material having an aspect ratio greater than about four to one (4:1). As such, the novel process improves both the yield and reliability over conventional processes.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for manufacturing an interconnect structure consisting essentially of:

forming a recess within a dielectric material situated on a semiconductor substrate, the recess extending below a top surface of the dielectric material;

forming a diffusion barrier layer substantially conformally on the top surface of the dielectric material and over an interior surface of the recess;

forming a seed layer on the diffusion barrier layer over the top surface of the dielectric material and within the recess, wherein the seed layer comprises tungsten and wherein the diffusion barrier layer is a different material than the seed layer;

forming an electrically conductive layer on the seed layer over the top surface of the dielectric material and substantially within the recess such that voids are present within the recess, the material of the diffusion barrier layer having a melting point greater than a melting point of a material of the electrically conductive layer, the material of the seed layer having a melting point greater than or equal to a melting point of the material of the electrically conductive layer;

forming an energy absorbing layer on the electrically conductive layer, a material of the energy absorbing layer having a greater thermal absorption capacity than the thermal absorption capacity of the material of the electrically conductive layer;

applying energy and pressure to the energy absorbing layer sufficient to cause the electrically conductive layer to fill the voids within the recess; and removing portions of the energy absorbing layer and the electrically conductive layer that are situated above the top surface of the dielectric material.

2. The method of claim 1, wherein forming a diffusion barrier layer comprises forming the diffusion barrier layer by chemical vapor deposition.

3. The method of claim 1, wherein forming a diffusion barrier layer comprises forming the diffusion barrier layer from a material selected from the group consisting of ceramics, metallics, and intermetallics.

4. The method of claim 1, wherein forming a diffusion barrier layer comprises forming the diffusion barrier layer from a material selected from the group consisting of aluminum nitride, tungsten nitride, titanium nitride, and tantalum nitride.

5. The method of claim 1, further comprising, prior to forming a seed layer on the diffusion barrier layer, heating the diffusion barrier layer in an environment substantially containing a nitrogen gas.

6. The method of claim 1, wherein forming a seed layer on the diffusion barrier layer comprises depositing the seed layer by chemical vapor deposition.

7. The method of claim 1, wherein forming an electrically conductive layer comprises forming the electrically conductive layer from a material selected from the group consisting of aluminum and copper.

8. The method of claim 1, wherein forming an energy absorbing layer comprises forming the energy absorbing layer from a material selected from the group consisting of titanium, titanium nitride, tungsten, tungsten nitride, silicon nitride, silicon dioxide, tantalum, tantalum nitride, and carbon.

9. The method of claim 1, wherein applying energy to the energy absorbing layer comprises applying the energy to the energy absorbing layer utilizing a furnace.

10. The method of claim 1, wherein removing portions of the energy absorbing layer and the electrically conductive layer comprises removing the portions of the energy absorbing layer and the electrically conductive layer by abrasive planarization.

11. The method of claim 1, wherein removing portions of the energy absorbing layer and the electrically conductive layer comprises removing the portions of the energy absorbing layer and the electrically conductive layer by chemical mechanical planarization.

12. The method of claim 1, further comprising forming the recess to have an aspect ratio greater than about four to one (4:1).

13. The method of claim 1, further comprising forming the recess to comprise a hole situated below a trench, the hole terminating at an end thereof at the semiconductor substrate and terminating at an opposite end thereof at the trench, the trench extending from the opposite end of the hole to the top surface of the dielectric material, the trench extending parallel to a plane of the semiconductor substrate.

14. The method of claim 1, wherein applying energy and pressure to the energy absorbing layer sufficient to cause the electrically conductive layer to fill the voids within the recess comprises applying sufficient energy and pressure to the energy absorbing layer to cause the electrically conductive layer to become flowable.

15. A method for manufacturing an interconnect structure consisting essentially of:
   forming a recess within a dielectric material situated on a semiconductor substrate, the recess extending below a top surface of the dielectric material;
   forming a diffusion barrier layer substantially conformally on the top surface of the dielectric material and over an interior surface of the recess;
   forming a seed layer on the diffusion barrier layer over the top surface of the dielectric material and within the recess, the diffusion barrier layer comprising a different material to that of a material of the seed layer, wherein the material of the seed layer is aluminum, titanium nitride, titanium, or titanium aluminide;
   forming an electrically conductive layer on the seed layer and substantially within the recess such that voids are present within the recess, the material of the diffusion barrier layer having a melting point greater than a melting point of a material of the electrically conductive layer, the material of the seed layer having a melting point greater than or equal to a melting point of the material of the electrically conductive layer;
   forming an energy absorbing layer on the electrically conductive layer, a material of the energy absorbing layer having a greater thermal absorption capacity than a thermal absorption capacity of the material of the electrically conductive layer;
   applying energy to the energy absorbing layer sufficient to cause the electrically conductive layer to fill the voids within the recess; and
   removing portions of the energy absorbing layer and the electrically conductive layer that are situated above the top surface of the dielectric material.

16. A method for manufacturing an interconnect structure consisting essentially of:
   forming a recess within a dielectric material situated on a semiconductor substrate, the recess extending below a top surface of the dielectric material;
   forming a diffusion barrier layer substantially conformally on the top surface of the dielectric material and over an interior surface of the recess;
   forming a seed layer on the diffusion barrier layer over the top surface of the dielectric material and within the recess, the diffusion barrier layer comprising a material having a melting point greater than that of a material of the seed layer, wherein the material comprising the seed layer is aluminum, titanium nitride, titanium, or titanium aluminide;
   forming an electrically conductive layer on the seed layer and substantially within the recess such that voids are present within the recess, the material of the diffusion barrier layer having a melting point greater than a melting point of a material of the electrically conductive layer, the material of the seed layer having a melting point greater than or equal to a melting point of the material of the electrically conductive layer;
   forming an energy absorbing layer on the electrically conductive layer, the material of the energy absorbing layer having a greater thermal absorption capacity than a thermal absorption capacity of the material of the electrically conductive layer;
   applying energy and pressure to the energy absorbing layer sufficient to cause the electrically conductive layer to fill the voids within the recess; and
   removing portions of the energy absorbing layer and the electrically conductive layer that are situated above the top surface of the dielectric material.

* * * * *